US010141250B2

United States Patent
Xin et al.

(10) Patent No.: US 10,141,250 B2
(45) Date of Patent: Nov. 27, 2018

(54) CHIP AND ELECTRONIC DEVICE

(71) Applicant: Huawei Technologies Co., Ltd., Shenzhen (CN)

(72) Inventors: Yuchen Xin, Bamako (ML); Nan Zhao, Shenzhen (CN); Chen Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 78 days.

(21) Appl. No.: 14/980,484

(22) Filed: Dec. 28, 2015

(65) Prior Publication Data

US 2016/0197051 A1 Jul. 7, 2016

(30) Foreign Application Priority Data

Jan. 4, 2015 (CN) .......................... 2015 1 0003747

(51) Int. Cl.
| | |
|---|---|
| *H01L 23/00* | (2006.01) |
| *H01L 23/498* | (2006.01) |
| *H01L 23/538* | (2006.01) |
| *H05K 1/18* | (2006.01) |

(52) U.S. Cl.
CPC .. *H01L 23/49811* (2013.01); *H01L 23/49816* (2013.01); *H01L 23/49827* (2013.01); *H01L 23/5381* (2013.01); *H01L 23/5386* (2013.01); *H05K 1/181* (2013.01); *H01L 24/13* (2013.01); *H01L 24/16* (2013.01); *H01L 2224/131* (2013.01); *H01L 2224/16227* (2013.01); *H01L 2224/81191* (2013.01); *H01L 2924/15311* (2013.01)

(58) Field of Classification Search
CPC .......... H01L 23/49811; H01L 23/5381; H01L 23/49816; H01L 23/49827; H05K 1/181
See application file for complete search history.

(56) References Cited

U.S. PATENT DOCUMENTS

| | | | | |
|---|---|---|---|---|
| 4,620,264 A | * | 10/1986 | Ushifusa | ................. C04B 35/18 174/257 |
| 7,250,684 B2 | * | 7/2007 | Nickerson | ............ B23K 20/004 228/180.5 |
| 8,860,193 B2 | * | 10/2014 | Sutardja | ................ H01L 21/568 257/676 |
| 9,275,689 B2 | * | 3/2016 | Ito | ..................... H01L 23/49816 |
| 9,372,503 B1 | * | 6/2016 | Miller | ....................... G06F 1/12 |

(Continued)

FOREIGN PATENT DOCUMENTS

JP 2011249551 A 12/2011

OTHER PUBLICATIONS

Machine Translation and Abstract of Japanese Publication No. JP2011249551, Dec. 8, 2011, 12 pages.

*Primary Examiner* — Nathan Milakovich
(74) *Attorney, Agent, or Firm* — Conley Rose, P.C.

(57) ABSTRACT

A chip includes a substrate and a die that are wrapped together by means of a packaging process. Multiple substrate cables corresponding to attachment points are laid out in the substrate. Solder joints in a solder joint matrix at a bottom of the substrate include a first solder joint group and a second solder joint group that are arranged along two parallel lines. Substrate cables connected to solder joints in the first solder joint group have an equal length. Substrate cables connected to solder joints in the second solder joint group have an equal length.

20 Claims, 3 Drawing Sheets

(56) References Cited

U.S. PATENT DOCUMENTS

| | | |
|---|---|---|
| 2006/0000876 A1 | 1/2006 | Nickerson et al. |
| 2006/0043477 A1 | 3/2006 | Akram |
| 2008/0164622 A1* | 7/2008 | Hayashi ............ H01L 23/49838 |
| | | 257/786 |
| 2011/0088007 A1* | 4/2011 | Coz .................... H01L 21/28525 |
| | | 716/113 |
| 2014/0300003 A1 | 10/2014 | Kariyazaki et al. |
| 2016/0128191 A1* | 5/2016 | Fukuchi .............. G06F 17/5031 |
| | | 174/258 |
| 2018/0098420 A1* | 4/2018 | Kariyazaki ............. H01L 23/32 |

\* cited by examiner

CHIP AND ELECTRONIC DEVICE

CROSS-REFERENCE TO RELATED APPLICATION

This application claims priority to Chinese Patent Application No. 201510003747.7, filed on Jan. 4, 2015, which is hereby incorporated by reference in its entirety.

TECHNICAL FIELD

Embodiments of the present disclosure relate to chip technologies, and in particular, to a chip and an electronic device in which the chip is mounted.

BACKGROUND

With continuous development of electronic integration technologies, an operating frequency of a chip is higher, and a stricter requirement is imposed on a time sequence relationship between signals. For signals transmitted at a high speed, for example, double data rate (DDR) signals, a time sequence relationship directly affects signal quality. If an input time sequence deviation of a chip on a board exceeds a design standard, an input instruction may not be executed. To ensure that the chip can work stably, a time sequence deviation between signals must be as small as possible. This requires that a circuit designed by chip designers should not only implement basic functions, but also perform time sequence control on signals properly if possible. Transmission of the signals on a package substrate and a printed circuit board (PCB) may cause a time sequence deviation. A length deviation of a signal transmission cable is an important factor that affects a time sequence. This requires that total lengths of cables, on the substrate and the PCB, of signals on which time sequence control needs to be performed should be as equal as possible, so that a time sequence deviation between the signals is minimized. Therefore, if a simple and high-efficiency method can be used to implement control on a signal time sequence on the package substrate, not only difficulties in chip design and layout and chip costs can be reduced, but also signal quality of a chip and competitiveness of the chip can be improved.

In view of this, a general manner in the prior art is to wind, on the substrate and the PCB, all circuit board cables that require time sequence control, so that the cables have equal lengths on the substrate and have equal lengths on the PCB, thereby achieving a same total length of a whole link, and further reducing the time sequence deviation between the signals. As shown in FIG. 1, a chip includes a die 11 and a substrate 14. The die and the substrate of the chip are wrapped together by using a packaging process. Herein, for ease of description, the substrate and the die are marked separately. Conductive bumps on a lower surface of the die 11 are connected to the substrate 14 fixedly by using solder balls 12. The substrate 14 is fixed on a PCB 17 by using solder balls 15. For visual description, three cables 13 are marked in the substrate, and three circuit board cables 19 are also laid out in the printed circuit broad 17. The three circuit board cables 19 correspond to the three substrate cables 13 in a one-to-one manner, to form three signal paths. As can be clearly seen from FIG. 1, to wind the three cables 13 into equal lengths on the substrate and reduce a time sequence deviation between the three signal paths, two of the cables 13 both include a serpentine cable 18 to prolong lengths of the two cables, likewise, two of the cables 19 also include a serpentine cable 16. In a disposing manner shown in FIG. 1, a large amount of cable winding space needs to be reserved on both the substrate 14 and the printed circuit broad 17 of the chip. Especially the cable winding space is limited because a size of the substrate 14 is small. Therefore, more cable layers may be required to implement equal-length control of signal cables. This may cause an increase of substrate layers, and is disadvantageous for chip cost control. In addition, an electronic device manufacturer needs to obtain, by various means, a delay of each path on the chip and the printed circuit board, and lay out a cable separately for each path, which increases production and design costs of an electronic device greatly.

SUMMARY

In view of this, embodiments of the present disclosure provide a chip, so as to simplify, by configuring correspondences between solder joints and path delays in groups, design and production difficulties during delay matching.

According to a first aspect, an embodiment of the present disclosure provides a chip, including a substrate and a die that are wrapped together by means of a packaging process, where conductive bumps are disposed on the die, an attachment point matrix and a solder joint matrix are arranged on a surface of the substrate, the conductive bumps are respectively attached to multiple attachment points in the attachment point matrix of the substrate to implement signal communication between the die and the substrate, multiple substrate cables corresponding to the multiple attachment points are laid out in the substrate, one end of each of the multiple substrate cables is connected to each of the multiple attachment points, and the other end is connected to each of multiple solder joints in the solder joint matrix of the substrate, where the multiple solder joints in the solder joint matrix include a first solder joint group and a second solder joint group that are arranged along two parallel lines, substrate cables connected to solder joints in the first solder joint group have an equal length, and substrate cables connected to solder joints in the second solder joint group have an equal length, and a length value of any substrate cable connected to a solder joint in the first solder joint group is a first length value, a length value of any substrate cable connected to a solder joint in the second solder joint group is a second length value, and a difference between the first length value and the second length value is equal to a preset standard value, which is a predetermined value.

In a first possible implementation manner of the first aspect, by using the first solder joint group and the second solder joint group, the chip sends, out of the chip, or receives, from outside the chip, signals that have a same delay requirement.

With reference to the first aspect or the first possible implementation manner of the first aspect, in a second possible implementation manner, the preset standard value is equal to a vertical distance between the two lines along which the first solder joint group and the second solder joint group are arranged.

With reference to the first aspect, the first possible implementation manner of the first aspect, or the second possible implementation manner of the first aspect, in a third possible implementation manner, the lines along which the solder joints in the first solder joint group and the second solder joint group are arranged are parallel to a same boundary of the substrate.

An embodiment of the present disclosure further provides an electronic device, where the chip is mounted onto the electronic device, so that the electronic device has an advantage of a low difficulty in producing a circuit board bearing the chip.

According to a second aspect, an embodiment of the present disclosure provides an electronic device, including a bearing circuit board and a chip mounted onto the bearing circuit board, where: the chip includes a substrate and a die that are wrapped together by means of package, conductive bumps are disposed on the die, an attachment point matrix and a solder joint matrix are arranged on a surface of the substrate, the conductive bumps are respectively attached to each of multiple attachment points in the attachment point matrix of the substrate to implement signal communication between the die and the substrate, multiple substrate cables corresponding to the multiple attachment points are laid out in the substrate, one end of each of the multiple substrate cables is connected to each of the multiple attachment points, and the other end is connected to each of multiple solder joints in the solder joint matrix of the substrate, where the multiple solder joints in the solder joint matrix include a first solder joint group and a second solder joint group that are arranged along two parallel lines, substrate cables connected to solder joints in the first solder joint group have an equal length, and substrate cables connected to solder joints in the second solder joint group have an equal length, a length value of any substrate cable connected to a solder joint in the first solder joint group is a first length value, a length value of any substrate cable connected to a solder joint in the second solder joint group is a second length value, and a difference between the first length value and the second length value is equal to a preset standard value, and pads corresponding to the solder joints in the first solder joint group and the second solder joint group in a one-to-one manner are disposed on the bearing board, and are configured to fix and electronically connect the chip, where all the pads are connected to circuit board cables, the circuit board cables connect the pads to signal interfaces of a same functional module on the bearing board, and a difference between a length of a circuit board cable on the pad corresponding to the first solder joint group and a length of a circuit board cable on the pad corresponding to the second solder joint group is equal to the preset standard value.

In a first possible implementation manner of the second aspect, by using the first solder joint group, the second solder joint group, the pads, and the circuit board cables, the chip sends, to the functional module on the bearing circuit board, or receives, from the functional module on the bearing circuit board, signals that have a same delay requirement.

With reference to the second aspect or the first possible implementation manner of the second aspect, in a second possible implementation manner of the second aspect, the preset standard value is equal to a vertical distance between the two lines along which the first solder joint group and the second solder joint group are arranged.

According to the chip and the electronic device provided in the present disclosure, on-chip delay deviations corresponding to at least two groups of solder joints in solder joints of the chip are fixed and can be obtained by means of calculation according to a size of a substrate of the chip, thereby reducing difficulties in layout of circuit board cables on a circuit board for bearing the chip.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show some embodiments of the present disclosure, and persons of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

The objectives of the embodiments of the present disclosure are to provide a simple and high-efficiency time sequence control method. A used method is to perform grouping and equal-length control on a substrate of a chip according to a signal cable layout depth. Solder joints at a same depth on the substrate are grouped into one group, substrate cables in the substrate corresponding to all solder joints in the group are controlled to have an equal length, and a difference between lengths of substrate cables corresponding to two adjacent solder joint groups is set to a standard preset value. By using this configuration method, when the two adjacent solder joint groups are used to transmit, out of the chip, or receive, from outside the chip, signals that have a same delay requirement, a deviation of on-chip delays of the signals of the two adjacent solder joint groups is fixed. In this way, when circuit board cables of a printed circuit board are laid out, the circuit board cables may be correspondingly laid out on the printed circuit board definitely according to positions and expected cable directions of the two adjacent solder joint groups. By such layout means, the substrate cables and the circuit board cables on the printed circuit board are laid out in units of groups, which reduces difficulties in cable layout.

A same delay requirement that signals mentioned in the embodiments of the present disclosure have means that delays in periods when the signals are sent out from a die of a chip, pass through different on-chip substrate cables and circuit board cables on a circuit board bearing the chip, and arrive at destinations are equal. Generally, the delays may be measured by using a total length of cables in the process. In an actual application, the signals having a same delay requirement are generally DDR address signals and data signals.

The chip and the electronic device provided in the present disclosure are described in further detail in the following with reference to the accompanying drawings.

Figure 1:
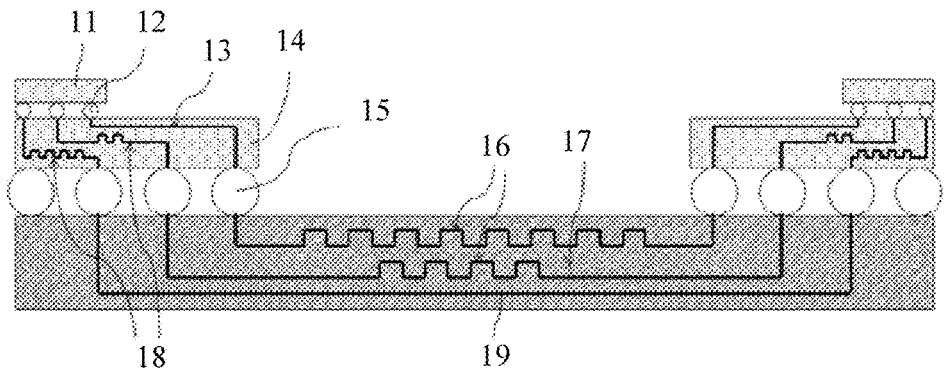
FIG. 1 is an assembly view of an electronic device in the prior art.
Figure 2:
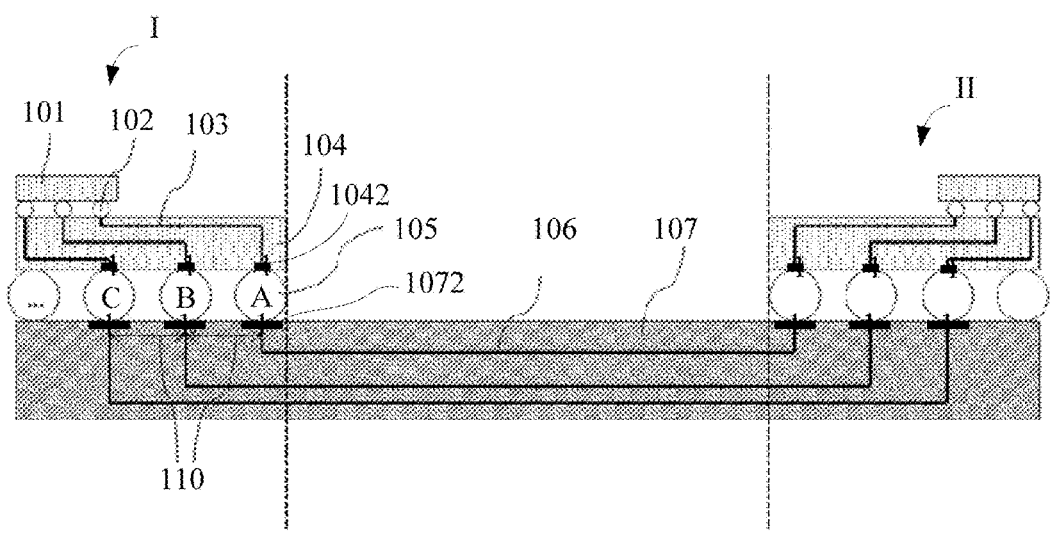
FIG. 2 is a schematic diagram of an electronic device according to an embodiment of the present disclosure.

FIG. 2 is a schematic diagram of an electronic device according to an embodiment of the present disclosure. The electronic device includes a bearing circuit board 107, where the bearing circuit board 107 may be a printed circuit board or may be another type of circuit board that can bear a chip. A chip I and a chip II are mounted on the bearing circuit board 107. The chip I and the chip II perform signal transmission between each other by using multiple circuit board cables 106 laid out on the bearing circuit broad. The chip I includes a substrate 104 and a die 101. Herein it should be noted that in an actual application, the substrate 104 and the die 101 should be wrapped together by using a packaging process, but in this embodiment of the present disclosure, for ease of description, no packaging medium is displayed in the accompany drawing. Conductive bumps are disposed at a bottom of the die 101, and the conductive bumps (not shown in the figure) are attached to attachment points (not shown in the figure) on an upper surface of the substrate 104 by using solder balls 102. Solder joints 1042 are disposed at a bottom of the substrate 104, and substrate cables 103 are laid out in the substrate 104. The substrate cables 103 connect the attachment points on the upper surface of the substrate 104 and the solder joints 1042 at the bottom of the substrate 104. Pads 1072 are disposed on an upper surface of the circuit board 107. The pads 1072 of the circuit board correspond to the solder joints 1042 at the bottom of the substrate 104 in a one-to-one manner. When the chip I is mounted on the bearing circuit board 107, the solder joints 1042 and the pads 1072 are electrically connected by solder balls 105 between the solder joints 1042 and the pads 1072, so that signal paths are established between the chip I and the bearing circuit board 107. A structure and a mounting manner of the chip II are similar to those of the chip I, and are not further described herein.

Figure 3:
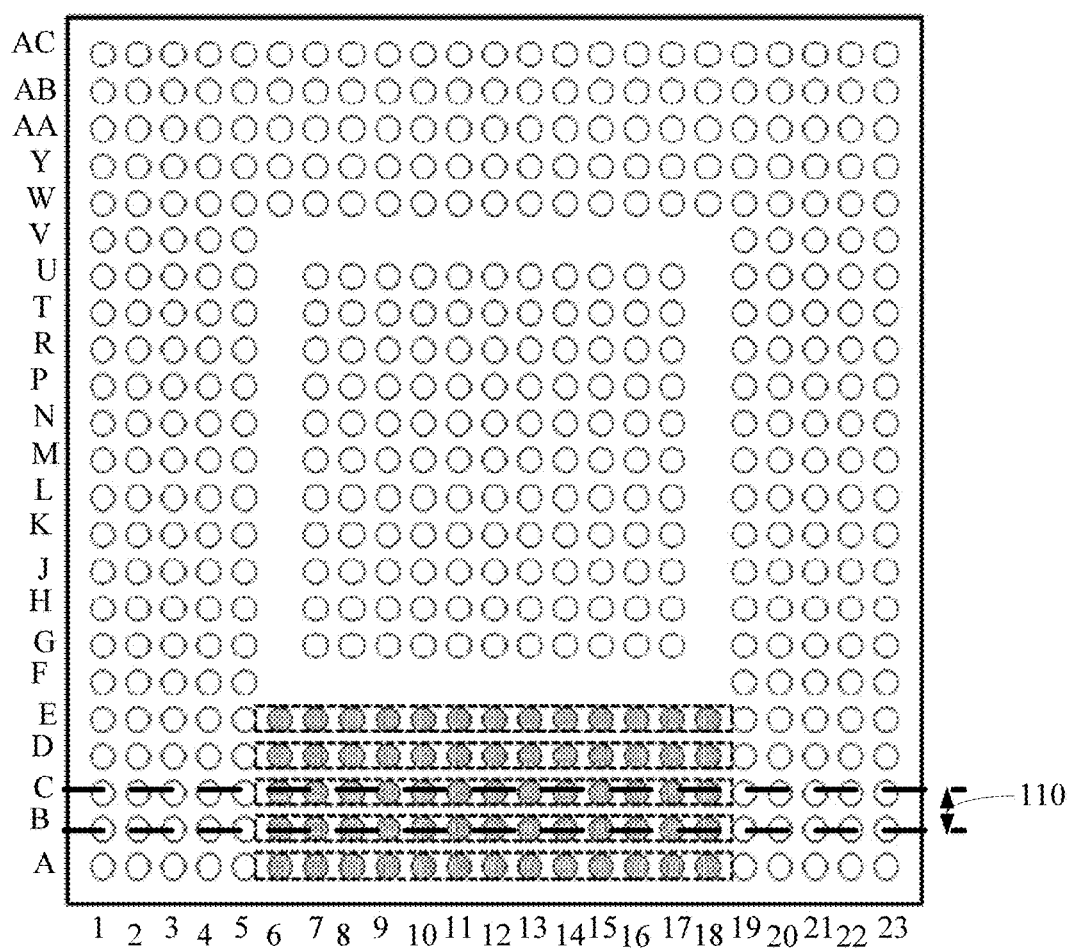
FIG. 3 is a bottom view of a substrate according to an optional embodiment of the present disclosure.

As shown in FIG. 3, solder joint arrays formed by rows of solder joints 1042 are disposed at the bottom of the substrate 104. The rows of solder joints are mutually parallel, and distances 110 between every two adjacent rows of solder joints are equal. Solder joints in a row A correspond to a position of a solder ball A shown in FIG. 2, and solder joints in a row B correspond to a position of a solder ball B shown in FIG. 2.

In this embodiment of the present disclosure, the solder joints 1042 on the substrate 104 are grouped according to their depths, that is, solder joints in the last row A close to an edge of the substrate 104 belong to a group A, solder joints in the row B that are separated by the solder joints in the row A from the edge of the substrate 104 belong to a group B, the solder joints in the row A and the solder joints in the row B are adjacent solder joint groups, and so on. Each group of solder joints is arranged in a line, and lines along which the groups of solder joints are arranged are mutually parallel. Substrate cables 103 connected to solder joints that belong to a same group have an equal length. A difference between lengths of substrate cables 103 corresponding to the two adjacent groups of solder joints, namely, the group A and group B, is a preset standard value.

In this way, in the chip, on the one hand, delay deviations, which are caused by the lengths of the substrate cables, of signals transferred by using the solder joints of the group A and the solder joints of the group B are determined. In this way, if the chip provided in this embodiment of the present disclosure is to be used in the electronic device, only lengths of the circuit board cables on the circuit board bearing the chip need to be considered. In addition, because distances of the solder joints of the group A and the solder joints of the group B relative to a boundary of the chip are definite, when the circuit board cables are laid out, as long as cable directions are definite, it is also easy to calculate length deviations, which are caused by different positions of the solder joints of the group A and the solder joints of the group B, of the circuit board cables relative to the chip II, thereby further reducing difficulties in layout of circuit board cables.

FIG. 2 further shows solder joints of a group C corresponding to a solder ball C, which correspond to solder joints in a row C on the substrate 104 shown in FIG. 3. The solder joints of the group C and the solder joints of the group B are adjacent, and a difference between a length of a cable corresponding to a solder joint of the group C and a length of a cable corresponding to a solder joint of the group B is also equal to the preset standard value. A distance between the solder joints of the group C and the solder joints of the group B is equal to a distance between the solder joints of the group B and the solder joints of the group A. Correspondingly, if signals that have a same delay requirement and are transmitted by using the solder joints of the group A and group B need to be transmitted by using the solder joints of the group C, a difference between a length of a circuit board cable corresponding to a solder joint of the group C and a length of a circuit board cable corresponding to a solder joint of the group B should be the standard preset value, or a difference between a length of a circuit board cable corresponding to a solder joint of the group C and a length of a circuit board cable corresponding to a solder joint of the group A is twice the standard preset value.

In a further embodiment, the preset standard value may be set to a distance between adjacent solder joint groups. For example, in this embodiment of the present disclosure, the distance between the solder joints of the group A and the solder joints of the group B is equal to a distance between a line that passes through centers of all solder joints in the solder joints of the group A and a line that passes through centers of all solder joints in the solder joints of the group B. In this manner, a difference between a distance from the solder joints of the group A to the edge of the substrate and a distance from the solder joints of the group B to the edge of the substrate is just equal to a difference between lengths of substrate cables corresponding to the solder joints of the group A and the solder joints of the group B. That is, when the circuit board cables are laid out on the bearing circuit board, lengths of the circuit board cables corresponding to the solder joints of the group B are longer than lengths of the circuit board cables corresponding to the solder joints of the group A by a distance between the solder joints of the group A and the solder joints of the group B, which just compensates for deviations of delays of the solder joints of the group A and the solder joints of the group B on the substrate cables. In this way, during layout, as long as directions of the circuit board cables corresponding to the solder joints of the group A and the solder joints of the group B in a coverage area of the chip I are vertical to an arrangement direction of the solder joints of the group A or the solder joints of the group B, deviations of lengths horizontally extended by the circuit board cables corresponding to the solder joints of the group A and the solder joints of the group B just compensate for the deviations of delays on the substrate cables, thereby further reducing difficulties in the layout of the circuit board cables. Further, in design of circuit board cables corresponding to the solder joints of the group C, the distance from the solder joints of the group A to the edge of the substrate and a difference from the solder joints of the group C to the edge of the substrate are equal to twice the distance between the solder joints of the group A and the solder joints of the group B, and the distance difference can also just be used to compensate for the difference between the lengths of the substrate cables corresponding to the solder joints of the group A and the solder joints of the group B. By analogy, solder joints in a row D and solder joints in a row E and so on may also be used to transmit signals that have a same delay requirement, as long as lengths of corresponding substrate cables increase in sequence.

Figure 4:
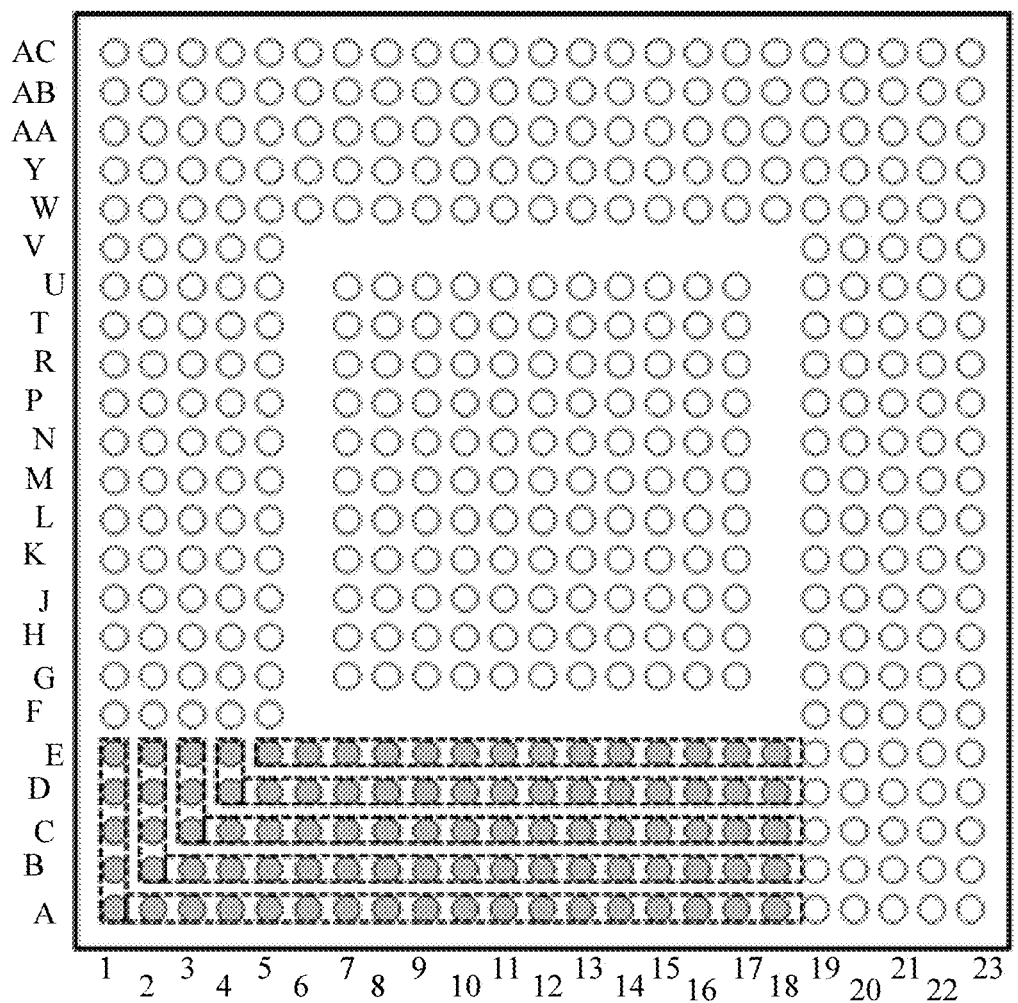
FIG. 4 is a bottom view of a substrate according to another embodiment of the present disclosure.

FIG. 4 is a schematic diagram of grouping solder joints of a substrate according to another embodiment of the present disclosure. At a bottom of a substrate shown in the figure, nine groups of solder joints are used to transmit signals having a same delay requirement, and are respectively: a first group of solder joints (A2-A18), a second group of solder joints (B3-B18), a third group of solder joints (C4-C18), a fourth group of solder joints (D5-D18), a fifth group of solder joints (E5-E18), a sixth group of solder joints (A1, B1, C1, D1, E1), a seventh group of solder joints (B2, C2, D2, E2), an eighth group of solder joints (C3, D3, E3), and a ninth group of solder joints (D4, E4). The first group of solder joints, the second group of solder joints, the third group of solder joints, the fourth group of solder joints, and the fifth group of solder joints are arranged in a parallel manner, and the sixth group of solder joints, the seventh group of solder joints, the eighth group of solder joints, and the ninth group of solder joints are arranged in a parallel manner. The first group of solder joints to the fifth group of solder joints are sequentially adjacent groups of solder joints, and their substrate cables and arrangement relationships are similar to those shown in FIG. 3, and are not further described herein. The sixth group of solder joints to the ninth group of solder joints may also be considered as sequentially adjacent and parallel groups of solder joints, and the substrate cables and arrangement rules shown in FIG. 3 in the foregoing embodiment may also be used for these groups of solder joints, to transfer signals having a same delay requirement. The arrangement of the sixth group of solder joints, the seventh group of solder joints, the eighth group of solder joints, and the ninth group of solder joints are vertical to the arrangement of the first to fifth groups of solder joints.

In an actual application, if the first group of solder joints to the ninth group of solder joints need to be used simultaneously to transfer signals having a same delay requirement, path delays of the first group of solder joints and the sixth group of solder joints may be first aligned, and then the method in the foregoing embodiments of the present disclosure may be used to align, by using the first group of solder joints and the sixth group of solder joints as a reference, path delays of solder joint groups that are arranged in parallel to the first group of solder joints and the sixth group of solder joints. Certainly, to save labor when path delays of vertically arranged solder joint groups and horizontally arranged solder joint groups are aligned, horizontal arrangement intervals of solder joints on the substrate may be equal to vertical arrangement intervals of the solder joints on the substrate. In addition, a distance from the first group of solder joints to a lower edge of the substrate is equal to a distance from the sixth group of solder joints to a left edge of the substrate.

It should be understood that although a solution of two interconnected chips is used in the electronic device in the foregoing embodiments, it is easily figured out that the chip II may also be replaced with another functional module having a specific function, such as an electronic device or a circuit module. The functional module may be interconnected with the chip I by using one or more signal interfaces.

In addition, the "length" value is described for many times in the embodiments of the present disclosure. For example, in an embodiment of the present disclosure, it is required that "A difference between lengths of the substrate cables 103 corresponding to the two groups of adjacent solder joints, namely, the group A and group B is a preset standard value". For another example, another optional embodiment describes "A difference between lengths of the substrate cables 103 corresponding to the two adjacent groups of solder joints, namely, the group A and group B is set to a distance between solder joints of the group A and solder joints of the group B". It is understandable to persons skilled in the art that in a case in which, for example, a value is assigned to the length value or in which it is stipulated that lengths are equal, a deviation always exists in engineering implementation. It is very difficult to implement 100 percent (%) equalization or perform processing and production completely according to the assigned value. Therefore, a positive and negative floating interval is generally set for this case in the industry, for example, +/−10 micrometer (μm). As long as a final result falls within the floating interval, the result is considered as satisfying a requirement. Likewise, a stipulation on the length in the present disclosure is also not an absolute concept, as long as the length is in a preset floating interval, for example, +/−10 μm, which should also fall within the protection scope of the present disclosure.

The foregoing embodiments are merely intended for describing the technical solutions of the present application, but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof; however, these modifications or replacements do not make the essence of corresponding technical solutions depart from the scope of the technical solutions in the embodiments of the present application.

What is claimed is:

1. A chip comprising:
   a substrate;
   a die wrapped together with the substrate by a package;
   a plurality of conductive bumps disposed on the die;
   an attachment point matrix arranged on a first surface of the substrate, the attachment point matrix comprising multiple attachment points;
   a solder joint matrix arranged on a second surface of the substrate, the solder joint matrix comprising a plurality of solder joints comprising a first solder joint group and a second solder joint group; and
   multiple substrate cables corresponding to the multiple attachment points, each of the multiple substrate cables extending through an entire thickness of the substrate and extending through a portion of a length of the substrate, each of the multiple substrate cables comprising a first end and a second end, each of the multiple substrate cables comprising at least one bend between the first end and the second end, each of the plurality of conductive bumps being electrically coupled to a corresponding one of the multiple attachment points, the first end of each of the multiple substrate cables being electrically coupled to a corresponding one of the multiple attachment points, the second end of each of the multiple substrate cables being electrically coupled to a corresponding one of the plurality of solder joints, the first solder joint group being arranged along a first parallel line, the second solder joint group being arranged along a second parallel line that is parallel to the first parallel line, a first subset of the multiple substrate cables electrically coupled to the first solder joint group being a first length value, a second subset of the multiple substrate cables electrically coupled to the second solder joint group being a second length value, and a difference between the first length value and the second length value equaling a predetermined value that is not equal to zero.

2. The chip of claim 1, wherein the first solder joint group is associated with a first transmission delay, the second solder joint group is associated with a second transmission delay, and the first transmission delay is different than the second transmission delay.

3. The chip of claim 1, wherein the first solder joint group is associated with a first reception delay, the second solder joint group is associated with a second reception delay, and the first reception delay is different than the second reception delay.

4. The chip of claim 1, wherein the predetermined value equals a distance between the first parallel line and the second parallel line.

5. The chip of claim 1, wherein the first parallel line and the second parallel line are parallel to a boundary of the substrate.

6. The chip of claim 1, wherein the plurality of solder joints further comprises a third solder joint group arranged along a third parallel line parallel to the first parallel line and the second parallel line, and a first spacing between the first parallel line and second parallel line is equal to a second spacing between the second parallel line and third parallel line.

7. The chip of claim 1, wherein the multiple substrate cables comprise substrate cables having at least three different lengths.

8. The chip of claim 1, wherein each of the multiple cables comprises at least two bends between the first end and the second end.

9. An electronic device, comprising:
a bearing circuit board;
a plurality of pads disposed on the bearing circuit board;
a chip mounted onto the bearing circuit board via the pads;
a functional module mounted on the bearing circuit board;
circuit board cables coupling signal interfaces of the functional module to the pads, the chip comprising:
a substrate;
a die wrapped together with the substrate by a package;
a plurality of conductive bumps disposed on the die;
an attachment point matrix arranged on a first surface of the substrate, the attachment point matrix comprising multiple attachment points;
a solder joint matrix arranged on a second surface of the substrate, the solder joint matrix comprising a plurality of solder joints comprising a first solder joint group and a second solder joint group;
multiple substrate cables corresponding to the multiple attachment points, each of the multiple substrate cables extending through an entire thickness of the substrate and extending through a portion of a length of the substrate, each of the plurality of conductive bumps being electrically coupled to a corresponding one of the multiple attachment points, each of the multiple substrate cables comprising a first and a second end, each of the multiple substrate cables comprising at least one bend between the first end and the second end, the first end of each of the multiple substrate cables being electrically coupled to a corresponding one of the multiple attachment points, the second end of each of the multiple substrate cables being electrically coupled to a corresponding one of the plurality of solder joints, the first solder joint group being arranged along a first parallel line, and the second solder joint group being arranged along a second parallel line;
a first subset of the multiple substrate cables electrically coupled to the first solder joint group being a first length value; and
a second subset of the multiple substrate cables electrically coupled to the second solder joint group being a second length value, a difference between the first length value and the second length value equaling a predetermined value that is not zero.

10. The electronic device of claim 9, wherein the first solder joint group is associated with a first transmission delay within the chip, the second solder joint group is associated with a second transmission delay within the chip, the first transmission delay is different than the second transmission delay, and transmissions to the functional module from the die via the first solder joint group and the second solder joint group comprise a same delay.

11. The electronic device of claim 9, wherein the first solder joint group is associated with a first transmission delay within the chip, the second solder joint group is associated with a second transmission delay within the chip, and transmissions from the functional module to the die via the first solder joint group and the second solder joint group comprise a same delay.

12. The electronic device of claim 9, wherein the predetermined value equals a distance between the first parallel line and the second parallel line.

13. The electronic device of claim 9, wherein a difference between a first length of a first of the circuit board cables coupled to a first of the pads and a second length of a second of the circuit board cables coupled to a second of the pads is equal to the predetermined value, the first of the pads corresponding to the first solder joint group, and the second of the pads corresponding to the second solder joint group.

14. The electronic device of claim 9, wherein the plurality of solder joints further comprises a third solder joint group arranged along a third parallel line parallel to the first parallel line and the second parallel line, and a first spacing between the first parallel line and second parallel line is equal to a second spacing between the second parallel line and third parallel line.

15. The electronic device of claim 9, wherein the multiple substrate cables comprise substrate cables having at least three different lengths.

16. The electronic device of claim 9, wherein each of the multiple cables comprises at least two bends between the first end and the second end.

17. The electronic device of claim 9, wherein the circuit board cables comprise circuit board cables having at least three different lengths.

18. The electronic device of claim 9, wherein each of the circuit board cables comprises at least two bends.

19. The electronic device of claim 9, wherein the circuit board cables comprise circuit board cables having at least three different lengths, and each of the circuit board cables comprises at least two bends.

20. The electronic device of claim 9, wherein the multiple substrate cables comprise substrate cables having at least three different lengths, each of the multiple cables comprising at least two bends between the first end and the second end, the circuit board cables comprising circuit board cables having at least three different lengths, and each of the circuit board cables comprising at least two bends.

* * * * *